United States Patent
Agrawal et al.

(10) Patent No.: US 10,571,519 B2
(45) Date of Patent: Feb. 25, 2020

(54) PERFORMING SYSTEM FUNCTIONAL TEST ON A CHIP HAVING PARTIAL-GOOD PORTIONS

(71) Applicant: INTERNATIONAL BUSINESS MACHINES CORPORATION, Armonk, NY (US)

(72) Inventors: Mitesh A. Agrawal, Karnataka (IN); Preetham M. Lobo, Bangalore (IN); Franco Motika, Hopewell Junction, NY (US); John D. Parker, Fishkill, NY (US); Gerard M. Salem, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 227 days.

(21) Appl. No.: 15/063,666

(22) Filed: Mar. 8, 2016

(65) Prior Publication Data
US 2017/0261551 A1 Sep. 14, 2017

(51) Int. Cl.
*G01R 31/317* (2006.01)
*G01R 31/3177* (2006.01)

(52) U.S. Cl.
CPC ... *G01R 31/3177* (2013.01); *G01R 31/31723* (2013.01)

(58) Field of Classification Search
CPC .............................................. G01R 31/318536
(Continued)

(56) References Cited

U.S. PATENT DOCUMENTS

| 4,523,313 A | 6/1985 | Nibby, Jr. et al. |
| 5,425,036 A | 6/1995 | Liu |

(Continued)

OTHER PUBLICATIONS

Crafts J. et al. "Testing the IBM Power 7 TM 4 GHz Eight Core Microprocessor", 2010 IEEE International Test Conference (ITC), Nov. 2-4, 2010. DOI: 10.1109/TEST.2010.5699204 See pp. 3-5.
(Continued)

*Primary Examiner* — Fritz Alphonse
(74) *Attorney, Agent, or Firm* — Cantor Colburn LLP; Margaret McNamara

(57) ABSTRACT

Embodiments include methods, and computer system, and computer program products for performing system functional test on a chip having partial-good portions. Aspects include: initializing, by system functional test software, a service engine of the chip, performing, by service engine, system functional test, and completing system functional test of chip. The chip may include service engine, a service engine memory and one or more "partial-good" portions. The initializing may include: loading system functional test software into the service engine memory, identifying each "partial-good" portion of the chip, writing a "partial-good" parameter for each "partial-good" portion of the chip identified to service engine memory, and triggering execution of system functional test. Method may include: decoding system functional test software, retrieving "partial-good" parameters, initializing "partial-good" portions of chip, and performing system functional test on "partial-good" portions of chip. The chip may include is a processor chip that has one or more "partial-good" cores.

11 Claims, 3 Drawing Sheets

(58) Field of Classification Search
USPC .................................. 714/726, 728, 731, 736
See application file for complete search history.

(56) References Cited

U.S. PATENT DOCUMENTS

| | | | |
|---|---|---|---|
| 5,757,181 | A | 5/1998 | Wolf et al. |
| 6,882,950 | B1* | 4/2005 | Jennion ........... G01B 31/318508 |
| | | | 702/118 |
| 6,968,286 | B1 | 11/2005 | Watkins |
| 7,093,174 | B2 | 8/2006 | Fenech Saint Genieys |
| 7,305,600 | B2 | 12/2007 | Farnsworth, III et al. |
| 7,484,153 | B2 | 1/2009 | Kiryu et al. |
| 7,610,537 | B2 | 10/2009 | Dickinson et al. |
| 7,640,476 | B2 | 12/2009 | Watkins |
| 7,769,557 | B2 | 8/2010 | Bey et al. |
| 8,405,413 | B2 | 3/2013 | Carpenter et al. |
| 8,769,360 | B2 | 7/2014 | Motika et al. |
| 8,868,975 | B2 | 10/2014 | Bellofatto et al. |
| 9,069,041 | B2 | 6/2015 | Douskey et al. |
| 9,857,422 | B2 | 1/2018 | Motika et al. |
| 10,247,624 | B2 | 4/2019 | Abdelmoneum et al. |
| 2001/0010091 | A1 | 7/2001 | Noy |
| 2002/0091979 | A1 | 7/2002 | Cook et al. |
| 2004/0103218 | A1* | 5/2004 | Blumrich ................. G06F 9/52 |
| | | | 709/249 |
| 2004/0225973 | A1 | 11/2004 | Johnson |
| 2006/0190792 | A1 | 8/2006 | Arnold et al. |
| 2006/0213972 | A1 | 9/2006 | Kelley et al. |
| 2007/0271070 | A1 | 11/2007 | Dmytriw et al. |
| 2008/0126911 | A1* | 5/2008 | Brittain ............ G01R 31/31712 |
| | | | 714/763 |
| 2008/0127103 | A1* | 5/2008 | Bak ................... G06F 11/3688 |
| | | | 717/126 |
| 2008/0317086 | A1 | 12/2008 | Santos et al. |
| 2011/0016153 | A1* | 1/2011 | Atta ..................... G06F 16/282 |
| | | | 707/797 |
| 2012/0290268 | A1 | 11/2012 | Bey et al. |
| 2013/0031418 | A1 | 1/2013 | Bellofatto et al. |
| 2013/0227367 | A1 | 8/2013 | Czamara et al. |
| 2013/0268357 | A1* | 10/2013 | Heath ..................... H04L 63/00 |
| | | | 705/14.53 |
| 2014/0097691 | A1 | 4/2014 | Jackson et al. |
| 2014/0237302 | A1 | 8/2014 | Berry, Jr. et al. |
| 2014/0298124 | A1 | 10/2014 | Douskey et al. |
| 2014/0344824 | A1 | 11/2014 | Bishop et al. |
| 2014/0351664 | A1* | 11/2014 | Akdemir .......... G01R 31/31908 |
| | | | 714/724 |
| 2017/0238108 | A1 | 8/2017 | Muza |
| 2017/0261551 | A1 | 9/2017 | Agrawal et al. |
| 2017/0261552 | A1 | 9/2017 | Motika et al. |
| 2018/0067162 | A1 | 3/2018 | Motika et al. |

OTHER PUBLICATIONS

List of IBM Patents or Patent Applications Treated as Related; (Appendix P), Filed May 2, 2016; 2 pages.
Franco Motika et al., "Methods and Systems for Generating Functional Test Patterns for Manufacture Test", U.S. Appl. No. 15/063,692, filed Mar. 8, 2016.
List of IBM Patents or Patent Applications Treated as Related; (Appendix P), Filed Sep. 19, 2017; 2 pages.
Mitesh Agrawal et al., "Methods and Systems for Performing Test and Calibration of Integrated Sensors", U.S. Appl. No. 15/063,731, filed Mar. 8, 2016.
Franco Motika et al., "Methods and Systems for Generating Functional Test Patterns for Manufacture Test", U.S. Appl. No. 15/169,842, filed Jun. 1, 2016.
Franco Motika et al., "Methods and Systems for Generating Functional Test Patterns for Manufacture Test", U.S. Appl. No. 15/809,389, filed Nov. 10, 2017.
IBM "List of IBM Patents or Patent Applications Treated As Related; (Appendix P)", Filed Oct. 2, 2018, 2 pages.
Mitesh Agrawal et al., "Methods and Systems for Performing Test and Calibration of Integrated Sensors," U.S. Appl. No. 16/017,102, filed Jun. 25, 2018.
Xin Cai, "A serial bitstream processor for smart sensor systems", (Doctoral dissertation, Duke University), 2010, 218 pages.

* cited by examiner

PERFORMING SYSTEM FUNCTIONAL TEST ON A CHIP HAVING PARTIAL-GOOD PORTIONS

BACKGROUND

The present disclosure relates generally to chip manufacturing, and more particularly to methods, systems and computer program products for performing system functional test on a chip having partial-good portions.

The rapid densification of very-large-scale integration (VLSI) devices, incorporating complex functions operating at extreme circuit performance, has driven the designs towards integrating many diverse functional macros or cores within these large chips. These macros range from autonomous processor cores with large cache arrays occupying relatively large portions of the chip's real estate, to a multitude of small arrays used as register stacks, trace arrays, content addressable memories, phase locked loops (PLLs), and many other special purpose logic functions. In conjunction with these higher integration densities and larger devices, current system architecture is shifting, in many applications, toward massively parallel processing utilizing multiple copies of these integrated cores. The number of processing cores can range from dual-cores to hundreds of cores per chip in the near future and to thousands of core arrays at system level. The independent logic units such as register stacks, trace arrays, content addressable memories, PLLs, as well as the cores in a processor are called "portions" of a chip here.

These highly integrated circuit functions, in conjunction with state-of-the-art semiconductor technology advances, usually result in relatively low device yields because even if one of the many portions of a chip is defective, then the entire chip is considered as defective. A further enhancement to the overall yield is to utilize partially "good" devices or devices that function acceptably with some defective macros.

The scenario outlined above surfaces several test and diagnostic problems that have driven the design and integration of many test functions within the same semiconductor devices. These built-in test and diagnostic functions are based on several Design for Test (DFT) techniques such as Scan design (LSSD, GSD), Logic & Array Built-in-self-test (LBIST & ABIST), On-product-clock-generation (OPCG), diverse service engines and others.

The problem addressed by this disclosure is encountered while concurrently testing multiple cores in a BIST test design environment. Specifically, the problem is to dynamically identify and de-configure the failing portions of the chip in real-time and exclude that core from further testing or terminate testing for insufficient number of functional cores.

Therefore, heretofore unaddressed needs still exist in the art to address the aforementioned deficiencies and inadequacies.

SUMMARY

In an embodiment of the present invention, a method for performing system functional test on a chip having partial-good portions may include: initializing, by system functional test software, a service engine of the chip undergoing system functional test, performing, by the service engine, system functional test, and completing the system functional test of the chip. In certain embodiments, the chip may include the service engine and a service engine memory. The chip may also include one or more "partial-good" portions. Each of the one or more "partial-good" portions is identified by a "partial-good" parameter. In certain embodiments, the initializing may include: loading the system functional test software into the service engine memory, identifying each "partial-good" portion of the chip, writing a "partial-good" parameter for each "partial-good" portion of the chip identified to a first predetermined location of the service engine memory, and triggering execution of the system functional test.

In certain embodiments, the performing may include: decoding the system functional test software, retrieving the "partial-good" parameters from the first predetermined location of the service engine memory, initializing the "partial-good" portions of the chip according to "partial-good" parameter, and performing system functional test on the "partial-good" portions of the chip. In certain embodiments, the completing may include writing results of the system functional test to a second predetermined location of the service engine memory.

In certain embodiments, the chip is a processor chip, and the processor chip may include one or more "partial-good" cores.

In another embodiment of the present invention, a computer system for performing system functional test on a chip having partial-good portions may include a processor, and a memory storing system functional test software for the computer system. When the system functional test software is executed at the processor, the system functional test software causes the computer system to perform: initializing a service engine of the chip undergoing system functional test, performing, by the service engine, system functional test, and completing the system functional test of the chip. In certain embodiments, the initializing may include: loading the system functional test software into the service engine memory, identifying each "partial-good" portion of the chip, writing a "partial-good" parameter for each "partial-good" portion of the chip identified to a first predetermined location of the service engine memory, and triggering execution of the system functional test. In certain embodiments, the performing may include: decoding the system functional test software, retrieving the "partial-good" parameters from the first predetermined location of the service engine memory, initializing the "partial-good" portions of the chip according to "partial-good" parameter, and performing system functional test on the "partial-good" portions of the chip. In certain embodiments, the completing may include writing results of the system functional test to a second predetermined location of the service engine memory. In certain embodiments, the chip is a processor chip, and the processor chip may include one or more "partial-good" cores.

In yet another embodiment of the present invention, a non-transitory computer readable storage medium may store system functional test software. When the system functional test software is executed by a processor of a computer system, the system functional test software causes the computer system to perform: initializing a service engine of the chip undergoing system functional test, performing, by the service engine, system functional test, and completing the system functional test of the chip. In certain embodiments, the initializing may include: loading the system functional test software into the service engine memory, identifying each "partial-good" portion of the chip, writing a "partial-good" parameter for each "partial-good" portion of the chip identified to a first predetermined location of the service engine memory, and triggering execution of the system functional test. In certain embodiments, the performing may include: decoding the system functional test software, retrieving the "partial-good" parameters from the first predetermined location of the service engine memory, initializing the "partial-good" portions of the chip according to "partial-good" parameter, and performing system functional test on the "partial-good" portions of the chip. In certain embodiments, the completing may include writing results of the system functional test to a second predetermined location of the service engine memory. In certain embodiments, the chip is a processor chip, and the processor chip may include one or more "partial-good" cores.

These and other aspects of the present disclosure will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1:
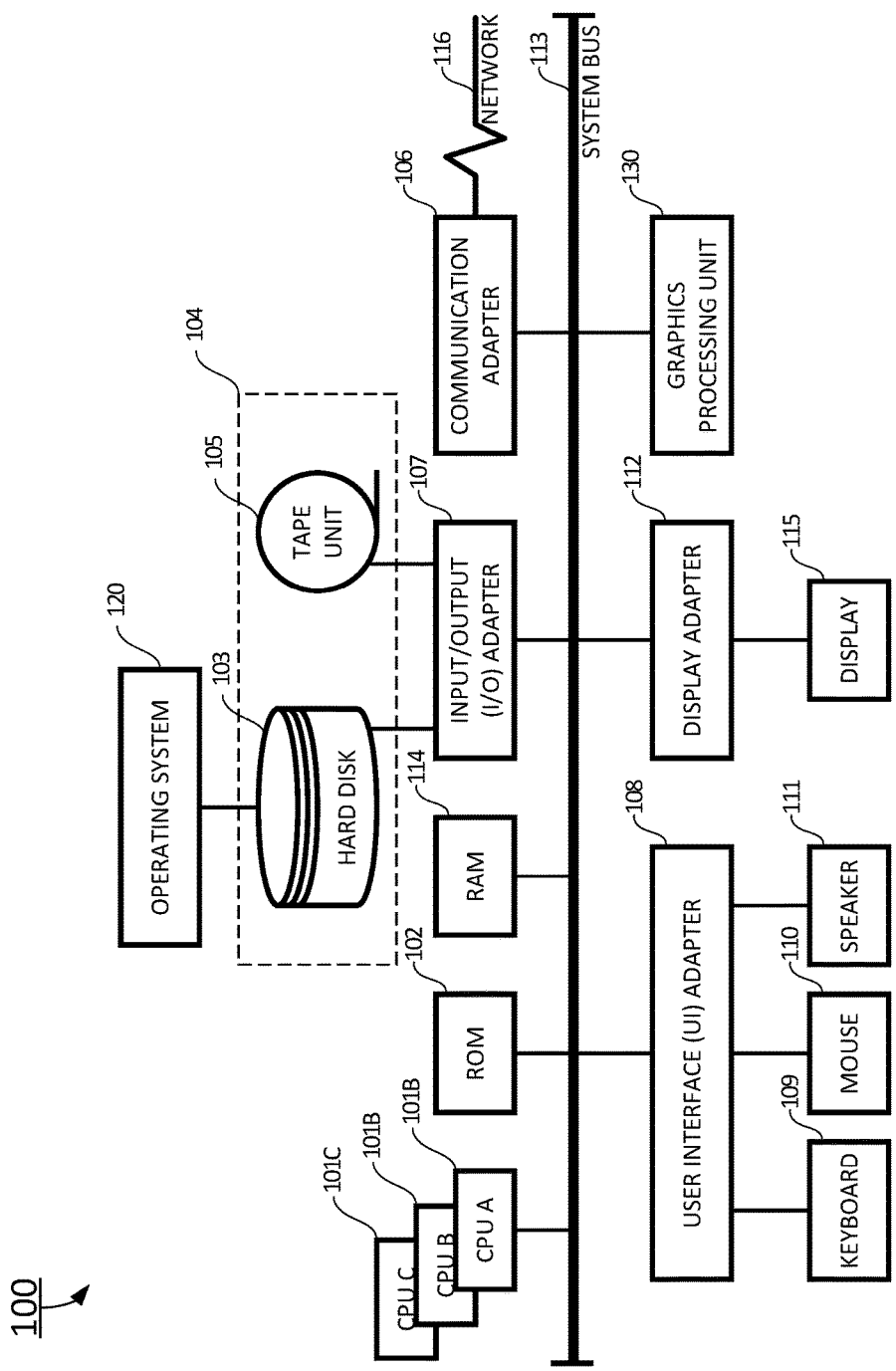
FIG. 1 is a block diagram illustrating an exemplary computer system for performing system functional test on a chip having partial-good portions according to certain embodiments of the present invention.

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The term computer program, as used above, may include software, firmware, and/or microcode, and may refer to programs, routines, functions, classes, and/or objects. The term shared, as used above, means that some or all code from multiple modules may be executed using a single (shared) processor.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings FIGS. 1-3, in which certain exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art.

Referring to FIG. 1, there is shown an embodiment of a computer system 100 for performing system functional test on a chip having partial-good portions and implementing the teachings herein. In this embodiment, the computer system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of the computer system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the computer system 100 may be stored in mass storage 104. A network adapter 106 interconnects bus 113 with an outside network 116 enabling the computer system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the computer system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the computer system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1. In certain embodiments, the network 116 may include symmetric multiprocessing (SMP) bus, a Peripheral Component Interconnect (PCI) bus, local area network (LAN), wide area network (WAN), telecommunication network, wireless communication network, and the Internet.

In certain embodiments, the computer system 100 may be connected to chip testing device where a chip is been tested (not shown in FIG. 1).

Figure 2:
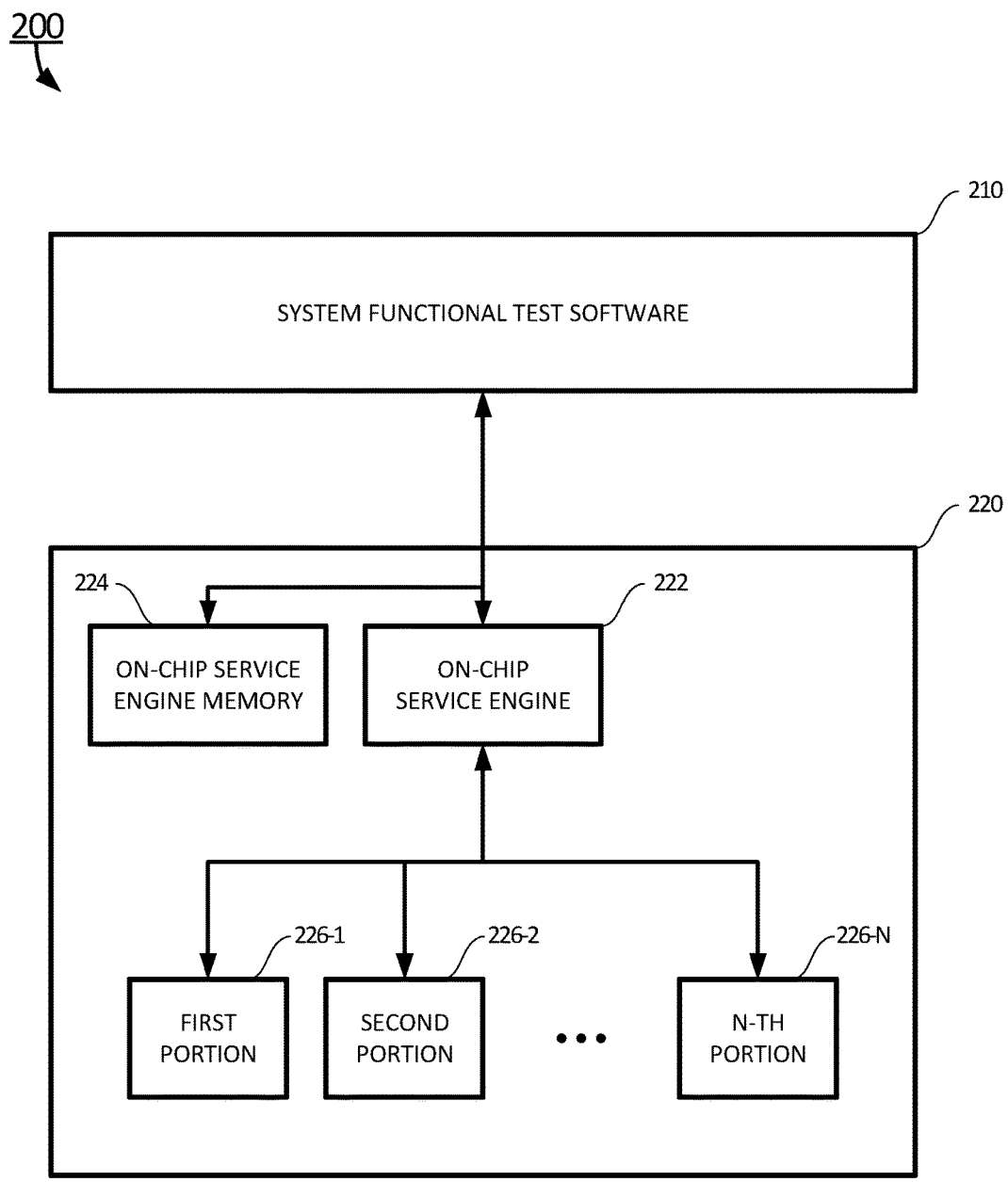
FIG. 2 is a structure view of a chip and system functional test software for performing system functional test on a chip having partial-good portions according to certain exemplary embodiments of the present invention.

Referring now to FIG. 2, a structure view 200 of a chip and system functional test software for performing system functional test on a chip having partial-good portions is shown according to certain exemplary embodiments of the present invention.

In certain embodiments, a system functional testing device (not shown in FIG. 2) may include system functional test software 210, and a chip 220 to be tested by the system functional testing device. The chip 220 may be mounted on the system functional testing device for testing. The chip 220 may include an on-chip service engine 222, an on-chip service engine memory 224, a first portion 226-1, a second portion 226-2, . . . , and N-th portion 226-N. The on-chip service engine 222 may be an on-chip highly optimized general purpose micro-controller. The on-chip service engine 222 may have its own instruction set architecture (ISA), and acts as a bridge between an external tester such as the computer system 100 and its intra-chip functional logic units. The on-chip service engine 222 is capable of performing any chip operations that any external tester program can perform.

In certain embodiments, the on-chip service engine memory 224 may be a volatile memory, such as the random-access memory (RAM), for storing the data and information during the operation of the system functional test. The service engine memory 224 may also include a non-volatile data storage media for system functional test software and other applications. Examples of the service engine memory 224 may include flash memory, memory cards, USB drives, hard drives, floppy disks, optical drives, or any other types of data storage devices.

The chip 220 may include certain number of different independent logic units (portions). As shown in FIG. 2, the first portion 226-1 may be a register, the second portion 226-2 may be an array of memory. The N-th portion 226-N may a core of a processor. The system functional test software 210, when executed at the on-ship service engine 222, may be configured to identify any of the portions of the chip 220 to be good, not good, and the whether the chip 220 is still functional when some of the portions 226-x are bad. Once the on-ship service engine 222 identifies some of the good portions, information of good portions of the chip 220 may be stored in a predetermined location of the service engine memory 224.

In certain embodiments, the hard disk 103 may store system functional test software for the computer system 100 for performing system functional test on a chip having partial-good portions. In certain embodiments, when the system functional test software is executed at the processor 101, the computer system 100 may perform: initializing, by system functional test software, the service engine 222 of the chip 220 undergoing system functional test, performing, system functional test by the service engine 222, and completing the system functional test of the chip 220. Each of the "partial-good" portions is identified by a "partial-good" parameter. In certain embodiments, the initializing may include: loading the system functional test software 210 into the service engine memory 224, identifying each "partial-good" portion of the chip 220, writing a "partial-good" parameter for each "partial-good" portion of the chip identified to a first predetermined location of the service engine memory 224, and triggering execution of the system functional test.

In certain embodiments, once the system functional test is triggered and started, the service engine 222 may decode the system functional test software, retrieve the "partial-good" parameters from the first predetermined location of the service engine memory 224, initialize the "partial-good" portions of the chip according to "partial-good" parameter, and perform system functional test on the "partial-good" portions of the chip 220. In certain embodiments, the completing may include writing results of the system functional test to a second predetermined location of the service engine memory 224.

In certain embodiments, the chip is a processor chip. The processor chip may include one or more "partial-good" cores.

Figure 3:
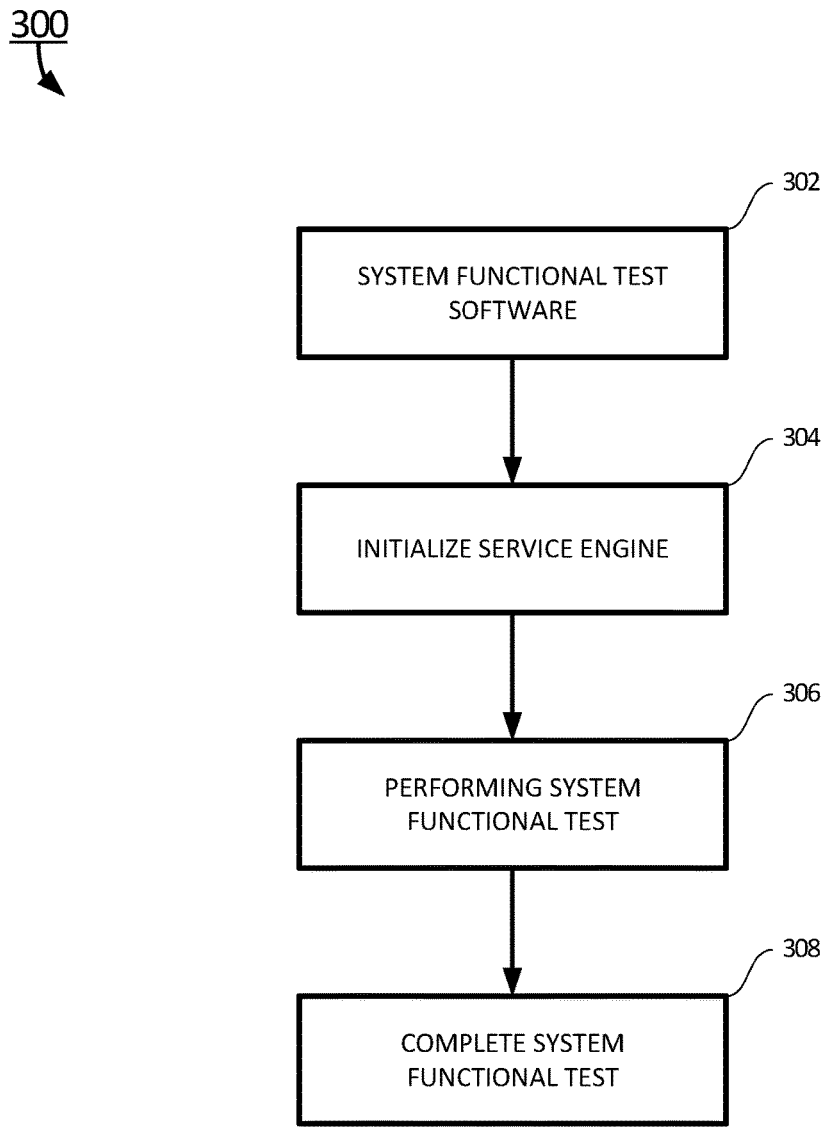
FIG. 3 is flow chart of an exemplary method for performing system functional test on a chip having partial-good portions according to certain embodiments of the present invention.

Referring now to FIG. 3, a flow chart of an exemplary method 300 performing system functional test on a chip having partial-good portions is shown according to certain embodiments of the present invention.

At block 302, a system functional test software 210 may be provided to the computer system 100, and an operator may issue a system functional test command to start the system functional test of a chip 220 at the computer system 100. The chip 220 is mounted on a system functional test device (not shown in FIGS. 1 and 2).

At block 304, the system functional test software 210 may initialize an on-chip service engine 222 to start the system functional test of the chip 220. In certain embodiments, the on-chip service engine 222 may load the system functional test software 210 into the service engine memory 224, then identify each "partial-good" portion of the chip 220, write a "partial-good" parameter for each "partial-good" portion of the chip identified to a first predetermined location of the service engine memory 224, and trigger execution of the system functional test.

At block 306, once the system functional test is triggered and started, the on-chip service engine 222 may decode the system functional test software 210, retrieve the "partial-good" parameters from the first predetermined location of the service engine memory 224, initialize the "partial-good" portions of the chip according to "partial-good" parameter, and perform system functional test on the "partial-good" portions of the chip 220.

At block 308, the on-chip service engine 222 may complete the system functional test of the chip 220 by writing results of the system functional test to a second predetermined location of the service engine memory 224. This memory location stores all of "partial-good" portions of the chip 220. Then an assessment may be performed to decide whether the chip 220 may still be functional or acceptable chip. The system functional test will not be perform in all defective portions of the chip.

In certain embodiments, the chip 220 may be a microprocessor. The method described here may be used to perform system functional test on the microprocessor to identify if any of the cores on the microprocessor chip is defective.

The present invention may be a computer system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for performing system functional test on a chip having partial-good portions comprising:
    initializing, by system functional test software, a service engine of the chip undergoing a system functional test, wherein the initializing includes:
        loading the system functional test software into a service engine memory of the chip;
        identifying each "partial-good" portion of the chip;
        writing a "partial-good" parameter for each "partial-good" portion of the chip identified to a first predetermined location of the service engine memory;
        triggering execution of the system functional test;
    performing, by the service engine, the system functional test, wherein the performing includes; and
        decoding the system functional test software;
        retrieving the "partial-good" parameters from the first predetermined location of the service engine memory;
        initializing the "partial-good" portions of the chip according to "partial-good" parameter; and
        performing the system functional test on the "partial-good" portions of the chip without performing the system functional test in all defective portions of the chip; and
    completing the system functional test of the chip.

2. The method of claim 1, wherein the chip comprises one or more "partial-good" portions, and each of the one or more "partial-good" portions is identified by a "partial-good" parameter.

3. The method of claim 1, wherein the completing comprises:
    writing results of the system functional test to a second predetermined location of the service engine memory.

4. The method of claim 1, wherein the chip comprises a processor chip, and the processor chip comprises one or more "partial-good" cores.

5. A computer system for performing system functional test on a chip having partial-good portions comprising a processor and a memory storing system functional test software for the computer system which, when executed at the processor of the computer system, are configured to perform:
    initializing a service engine of the chip undergoing system functional test, wherein the chip comprises one or more "partial-good" portions, and each of the one or more "partial-good" portions is identified by a "partial-good" parameter, and wherein the initializing includes:
        loading the system functional test software into the service engine memory;
        identifying each "partial-good" portion of the chip;
        writing a "partial-good" parameter for each "partial-good" portion of the chip identified to a first predetermined location of the service engine memory;
        triggering execution of the system functional test;
    performing, by the service engine, the system functional test, wherein the performing includes:
        decoding the system functional test software;
        retrieving the "partial-good" parameters from the first predetermined location of the service engine memory;
        initializing the "partial-good" portions of the chip according to "partial-good" parameter; and
        performing system functional test on the "partial-good" portions of the chip without performing the system functional test in all defective portions of the chip; and
    completing the system functional test of the chip.

6. The computer system of claim 5, wherein the chip comprises the service engine, and a service engine memory.

7. The computer system of claim 6, wherein the completing comprises:
    writing results of the system functional test to a second predetermined location of the service engine memory.

8. The computer system of claim 5, wherein the chip comprises a processor chip, and the processor chip comprises the one or more "partial-good" cores.

9. A computer program product operable on a computer system for performing system functional test on a chip having partial-good portions, comprising a non-transitory computer storage medium readable by the computer system having a processor and a memory configured to store system functional test software for execution by the processor of the computer system for performing a method comprising:
    initializing a service engine of the chip undergoing system functional test, wherein the chip comprises one or more "partial-good" portions, and each of the one or more "partial-good" portions is identified by a "partial-good" parameter, and wherein the initializing includes:
        loading the system functional test software into the service engine memory;
        identifying each "partial-good" portion of the chip;
        writing a "partial-good" parameter for each "partial-good" portion of the chip identified to a first predetermined location of the service engine memory;
        triggering execution of the system functional test;

performing, by the service engine, the system functional test, wherein the performing includes:
  decoding the system functional test software;
  retrieving the "partial-good" parameters from the first predetermined location of the service engine memory;
  initializing the "partial-good" portions of the chip according to "partial-good" parameter; and
  performing system functional test on the "partial-good" portions of the chip without performing the system functional test in all defective portions of the chip; and
completing the system functional test of the chip.

10. The computer program product of claim 9, wherein the completing comprises:
  writing results of the system functional test to a second predetermined location of the service engine memory.

11. The computer program product of claim 9, wherein the chip comprises a processor chip, and the processor chip comprises the one or more "partial-good" cores.

* * * * *